(12) United States Patent
Fernandez Banares et al.

(10) Patent No.: US 8,710,850 B2
(45) Date of Patent: Apr. 29, 2014

(54) SYSTEM AND METHOD FOR DETECTING AN EARTH GROUND FAULT OF AN EXTERNAL POWER SUPPLY CONNECTED TO A VEHICLE

(75) Inventors: Jose Gabriel Fernandez Banares, Ta (ES); Albert Trenchs Magana, Valls (ES)

(73) Assignee: Renault S.A.S., Boulogne-Billancourt (FR)

( * ) Notice: Subject to any disclaimer, the term of this patent is extended or adjusted under 35 U.S.C. 154(b) by 328 days.

(21) Appl. No.: 13/302,579

(22) Filed: Nov. 22, 2011

(65) Prior Publication Data

US 2012/0161778 A1    Jun. 28, 2012

Related U.S. Application Data

(60) Provisional application No. 61/427,336, filed on Dec. 27, 2010.

(51) Int. Cl.
*G01R 31/00*    (2006.01)
*H02H 9/08*    (2006.01)
*H02H 3/00*    (2006.01)

(52) U.S. Cl.
USPC .................. 324/503; 361/42; 361/44; 702/58

(58) Field of Classification Search
USPC ................. 324/503, 500, 521, 555, 620, 622, 324/76.52, 76.77; 702/57–59, 127, 185, 702/183, 182; 701/29.9, 31.6, 31.8; 361/1, 361/42, 44–49
See application file for complete search history.

(56) References Cited

U.S. PATENT DOCUMENTS

| | | | |
|---|---|---|---|
| 5,606,480 A | 2/1997 | Nevo | |
| 6,718,271 B1 * | 4/2004 | Tobin | 702/58 |
| 7,050,279 B2 * | 5/2006 | Nojima | 361/42 |
| 7,400,476 B1 | 7/2008 | Hull, Jr. | |
| 8,149,551 B2 * | 4/2012 | Vedula et al. | 361/42 |

FOREIGN PATENT DOCUMENTS

EP    2 159 898 A1    3/2010
GB    2 167 618 A    5/1986

OTHER PUBLICATIONS

Partial European Search Report issued Nov. 4, 2011 in related EP Application No. 10 19 6017.7.

* cited by examiner

*Primary Examiner* — Hoai-An D Nguyen
(74) *Attorney, Agent, or Firm* — Oblon, Spivak, McClelland, Maier & Neustadt, L.L.P.

(57) ABSTRACT

A system and method is provided for determining the existence of a ground fault connection within a vehicle. An electrical connector may be provided for electrically connecting the vehicle to an external Alternating Current (AC) power source. The electrical connector includes a three phase electrical connector configured to receive a corresponding input voltage signal on a phase, neutral, and earth connection. A controller being configured to determine whether a faulty earth connection exists between the vehicle and the AC power source the phase connection does not exceed the predetermined phase threshold when referenced to the earth connection and the neutral connection does not exceed the predetermined neutral threshold when referenced to the earth connection or the phase connection exceeds the predetermined phase threshold when referenced to the earth connection and the neutral connection exceeds the predetermined neutral threshold when referenced to the earth connection.

18 Claims, 5 Drawing Sheets

SYSTEM AND METHOD FOR DETECTING AN EARTH GROUND FAULT OF AN EXTERNAL POWER SUPPLY CONNECTED TO A VEHICLE

BACKGROUND OF THE INVENTION

1. Field of the Invention

One or more embodiments of the present disclosure relate to a system and method for detecting an earth ground fault of an external power supply that is electrically connected to a vehicle.

SUMMARY OF THE INVENTION

A system and method is provided for determining the existence of a ground fault connection of an external power supply that is electrically connected to a vehicle. An electrical connector may be provided for electrically connecting the vehicle to an external Alternating Current (AC) power source. The electrical connector may include a three phase electrical connector configured to receive a corresponding input voltage signal on a phase, neutral, and earth connection. A controller may also be provided for determining whether the input signal received on the phase and neutral connections exceed a predetermined phase and neutral threshold. The controller further being configured to determine whether a faulty earth connection exists between the vehicle and the AC power source when the input signal received from the phase connection does not exceed the predetermined phase threshold and the input signal received from the neutral connection does not exceed the predetermined neutral threshold.

DETAILED DESCRIPTION OF THE PREFERRED EMBODIMENT(S)

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

With the rise in popularity of hybrid-electric and electric vehicles, users are now being required to provide electric power to their vehicles from an external alternating current (AC) power supply. Unfortunately, the possibility exists that a user may experience severe or fatal electric shock while connecting the vehicle to the external AC power supply. Such a possibility of injury may result when a faulty earth (or ground) connection exists between the vehicle electrical connector and the external AC power supply. The possibility of a user being injured, severely shocked, or electrocuted as a result of a ground fault has resulted in the need to provide some form of ground fault protection and/or detection.

In light of the foregoing, the present disclosure provides for a system and method of detecting an earth ground fault when a vehicle is electrically connected to an external Alternating Current (AC) power source. More particularly, the present disclosure provides a system and method of detecting an earth connection failure using a battery charger block system located within a vehicle.

Figure 1:
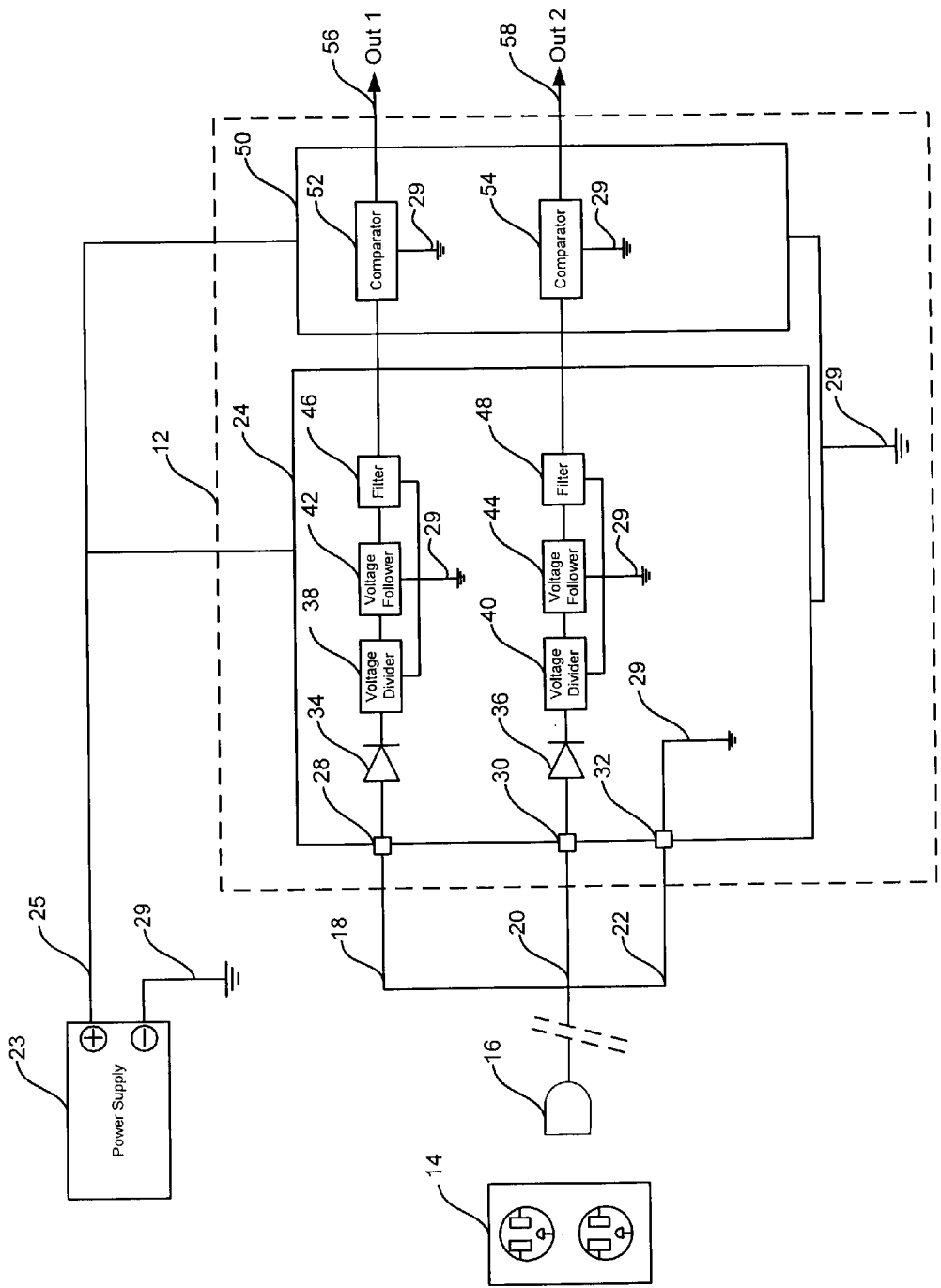
FIG. 1 is a block diagram representation of a ground fault detection circuit according to one non-limiting embodiment of the present disclosure.

With reference to the drawings, FIG. 1 illustrates a ground fault detection circuit 12 which may be located within a vehicle (not shown). The ground fault detection circuit 12 may be configured to detect various conditions that may occur when a battery charger block 10 is electrically connected to an external AC power supply 14. In one non-limiting example, the ground fault detection circuit 12 may be configured to determine when a proper electrical connection between the battery charger block 10 and the AC power supply 14 is established. In another non-limiting example, the ground fault detection circuit 12 may be configured to determine when a faulty or "bad" earth connection, or ground-fault, is established between the battery charger block 10 and the AC power supply 14. In another non-limiting example, the ground fault detection circuit 12 may be configured to determine when a proper earth connection between the battery charger block 10 and the AC power supply 14 may be properly established, but the earth connection signal may be of poor quality. Stated differently, the ground fault detection circuit 12 may be capable of determining when an earth connection is established, but the electrical impedance between the battery charger block 10 and the AC power supply 14 may be at a level that may result in injury to the user.

Based upon the various conditions detected, the ground fault detection circuit 12 may supply one or more output signals which may be used to activate a vehicle safety system. The present disclosure contemplates that the vehicle safety system may be a combination of visual and/or audible warnings which indicate to the user that an improper earth ground connection has been established. Alternatively, the vehicle safety system may activate a protection circuit used to safeguard the user from any potential injury, shock or electrocution which may occur as a result of the faulty or "bad" earth connection. For example, if activated the protection circuit may operate to disable any further charging process from proceeding.

With reference back to the drawings, FIG. 1 further illustrates an electrical socket 16 that may be adapted to connect to the external AC power source 14. The present disclosure contemplates that the electrical socket 16 may allow an electrical connection with a 120 or 220 volt AC power supply. The electrical socket 16 may be a three phase connection that includes a phase connection 18, a neutral connection 20, and an earth or ground connection 22. Each of the phase, neutral, and earth connections 18, 20, 22 may be input to the battery charger block 10 in order to detect a faulty earth connection.

A power supply 24 having a pair of positive and negative terminal connections may be included within the vehicle. The positive terminal connection may provide a positive direct current (DC) power supply to the electrical components of the battery charger block 10. The present disclosure contemplates that the power supply 24 may be the 12 or 24 volt DC power supply located within the vehicle. The negative terminal of the power supply 24 may be connected to the earth connection 22. As such, the negative terminal of the power supply 24 may provide a ground reference 29 for all the electrical components within the battery charger block 10 as well as the vehicle.

The adaptation block 24 may be configured to convert voltage received from the AC power supply 14 to a level that may be properly managed by the battery charger block 10. As is further illustrated, the adaptation block 24 may also include a first, second, and third input connection 28, 30, 32 which may be electrically connected to the phase, neutral, and ground connections 18, 20, 22. While FIG. 1 presently illustrates the phase and neutral connections 18, 20 being respectively connected to the first and second connections 28, 30, the present disclosure contemplates that the adaptation block 24 may be configured so that the phase and neutral connections 18, 20 may be connected to either the first or second input connection 28, 30.

The adaptation block 24 may further include a pair of limiting circuits 34, 36 which may be configured to receive a phase and neutral signal from the first and second input connections 28, 30 respectively. The limiting circuits 34, 36 may be configured to clip or select only the positive semi-cycle AC voltage signal of each phase and neutral signal received. The present disclosure contemplates that the limiting circuits 34, 36 may include a diode circuit that may operate to clip or select the positive semi-cycle signal of each phase and neutral signal received. Each positive semi-cycle signal generated by the limiting circuits 34, 36 may then be transmitted to a pair of voltage divider circuits 38, 40. The voltage divider circuit may be configured to decrease the positive semi-cycle signal to a fraction of the signal level received from the limiting circuits 34, 36. The present disclosure further contemplates that the voltage divider circuits 38, 40 may further include a zener diode circuit configured to limit the maximum voltage of each positive semi-cycle signal received.

The adaptation block 24 may further include a pair of voltage follower circuits 42, 44 configured to receive the modified positive semi-cycle signal from the voltage dividers 38, 40. The voltage follower circuits may be configured to modify or adapt the impedances and drive the current of each respective positive semi-cycle signal received. The positive semi-cycle signal may then be transmitted from the voltage follower circuits 42, 44, to a pair of filter circuits 46, 48. The present disclosure contemplates that the filter circuits 46, 48 may be a low-pass filter configured to reject high frequency noise that may be present in the received positive semi-cycle signal. More particularly, the filter circuits 46, 48 may operate to eliminate the high frequency noise that may be present in the phase and neutral signals initially received from the phase and neutral connections 18, 20. Each filter circuit 46, 48 may then transmit each respective positive semi-cycle signal from the adaptation block 24 to a comparator block 50.

The comparator block 50 may include a pair of comparators 52, 54 configured to receive the filtered positive semi-cycle signal from the adaptation block 24. Each comparator 52, 54 may further be configured to measure, or compare, the filtered positive semi-cycle signal against a fixed reference voltage. More particularly, each comparator 52, 54 may be configured to determine when the voltage levels of the positive semi-cycle signal received from the phase or neutral connections 18, 20 is above the reference voltage. The present disclosure contemplates that the comparator block 54 may also be part of a controller (not shown). The controller may be configured to receive and compare the filtered positive semi-cycle signal from the adaptation block 24 using preconfigured internal software functions. The present disclosure contemplates that the reference voltage may be pre-determined to a level that accommodates for various government safety regulations.

For example, the present disclosure contemplates that comparators 52, 54 may be configured to measure whether each filtered positive semi-cycle signal exceeds a reference voltage of 50 volts. If the signal initially received from the phase connection 18 is determined to exceed the 50 volt reference, then a corresponding output voltage signal 56 (e.g., Out1) may be generated. In addition, if the signal initially received from the neutral connection 20 is determined to not exceed the 50 volt reference, then a corresponding output voltage signal 58 (e.g., Out2) may also be generated.

As stated above, the output voltage signals 56, 58 may be used to determine whether a vehicle safety system (not shown) should be activated. The present disclosure contemplates that the vehicle safety system may include a number of audible and/or visual warning indicators configured to alert the operator that a faulty or "bad" ground connection has been established between the battery charger block 10 and the AC power supply 14. Alternatively, the vehicle safety system may activate a protection circuit used to safeguard the user from any potential injury, shock or electrocution which may occur as a result of the faulty or "bad" earth connection. As stated above, in one non-limiting example the protection circuit may operate to disable the charging process (i.e., disable the battery charger block 10 from receiving voltage supplied from the AC power supply 14).

Figure 2:
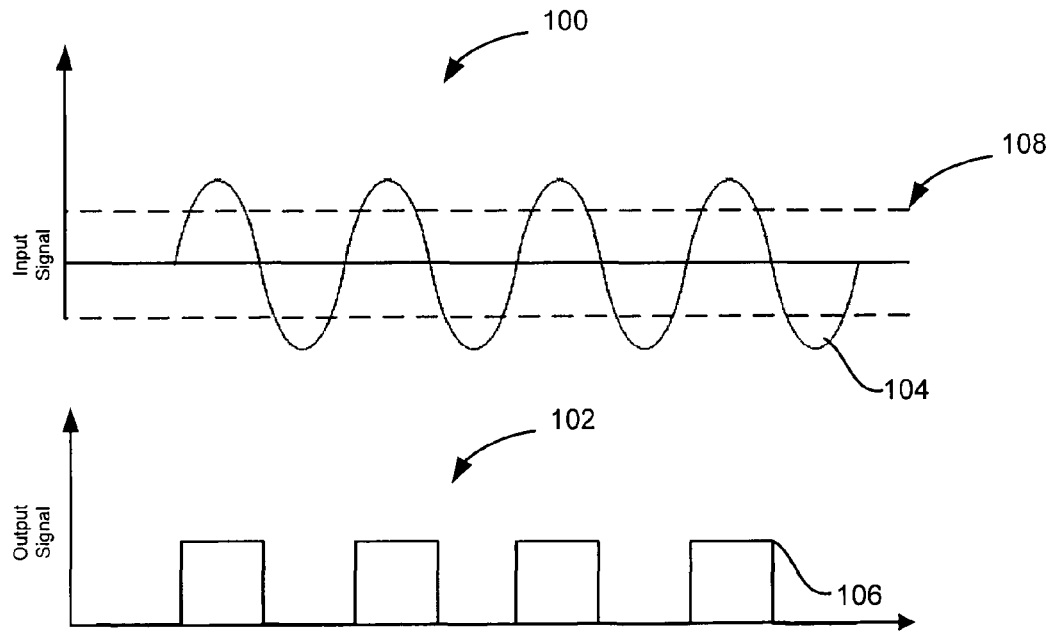
FIG. 2 is a pair of exemplary charts illustrating an input signal from a phase connection having a good earth connection and a corresponding output signal according to one embodiment of the present disclosure.
Figure 3:
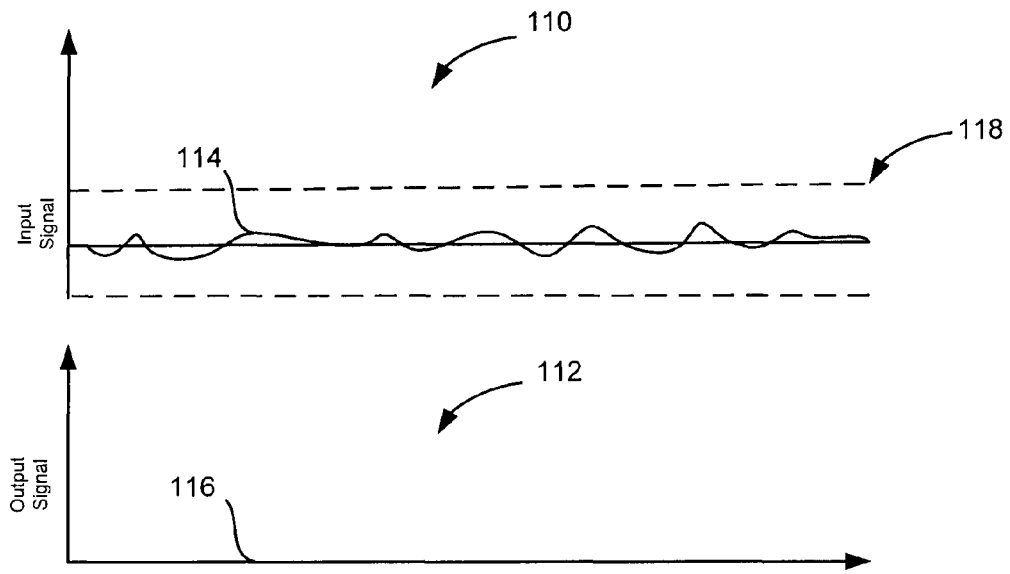
FIG. 3 is a pair of exemplary charts illustrating an input signal from a neutral connection having a good earth connection and a corresponding output signal according to one embodiment of the present disclosure.

With reference to FIGS. 2 and 3, a series of graphs 100, 102, 110, 112 illustrate the condition when the ground fault detection circuit 12 determines a valid earth connection may exist between the battery charger block 10 and the AC power supply 14. As illustrated, graph 100 includes an input signal 104 indicative of the signal initially received from the phase connection 14 at the first input connection 28. The present disclosure contemplates that the effective voltage of the output signal 104 may vary depending upon the connection between the battery charger block 10 and the AC power supply 14. For example, the effective voltage of the input signal 104 may vary depending upon whether the AC power supply 14 is supplying a 120 or 220 voltage signal. With reference to FIG. 3, graph 110 illustrates an input signal 114 indicative of the signal initially received from the neutral connection 20 at the second input connection 30.

FIG. 2 further illustrates a corresponding output signal 106 (e.g., Out1) that may be generated by the battery charger block 10. As explained above, the input signal 104 may be corrected by the adaptation block 24 so that only a positive semi-cycle signal is evaluated. In addition, a reference voltage limit 108 may be established to determine when the input signal 104 exceeds a pre-defined voltage threshold. The reference voltage limit 108 may be the reference voltage established by comparator 52. As illustrated, when the input signal 104 exceeds the reference voltage limit 108 the comparator 50 may generate a pulsed square wave output signal 106. The present disclosure further contemplates that the reference voltage limit 108 may vary depending upon the effective voltage of the input signal 104. Once the input signal has been evaluated, the output signal 106 may be generated to indicate that the earth connection 22 does not indicate an earth ground fault.

With reference to FIG. 3, the battery charger block 10 may also evaluate the input signal 124 initially received from the neutral connection 30. The present disclosure contemplates that the input signal 114 illustrated may be indicative of a signal received from the neutral connection 20 having nominal or negligible noise. As illustrated, the battery charger block 10 may determine that the input signal 114 does not exceed the reference voltage limit 118 which may be established by comparator 54. Because the input voltage 114 does not exceed the reference voltage limit 118, the battery charger block 10 may generate a minimal or zero output signal 116 (e.g., Out2). As stated above, the input signals 104, 114 and corresponding output signals 106, 116 are an exemplary illustration of the condition when the ground fault detection circuit 12 determines a valid earth connection may exist between the battery charger block 10 and the AC power supply 14.

For example, the present disclosure contemplates that if Out1 generates a pulsed square wave output signal, as illustrated in FIG. 2, and Out2 generates a minimal or zero output signal, as illustrated in FIG. 3, then the fault detection circuit 12 may determine that a valid earth connection exists between the battery charger block 10 and the AC power supply 14. Also, if Out2 generates a pulsed square wave output signal, and Out1 generates a minimal or zero output signal, then the fault detection circuit 12 may again determine that a valid earth connection exists between the battery charger block 10 and the AC power supply 14.

However, if Out1 generates a minimal or zero output signal and Out2 generates a minimal or zero output signal, then the fault detection circuit 12 may determine that a faulty earth connection exists between the battery charger block 10 and the AC power supply 14. Also, if Out1 generates a pulsed square wave output signal and Out2 generates a pulsed square wave output signal, then the fault detection circuit 12 may determine that a faulty earth connection exists between the battery charger block 10 and the AC power supply 14.

Figure 4:
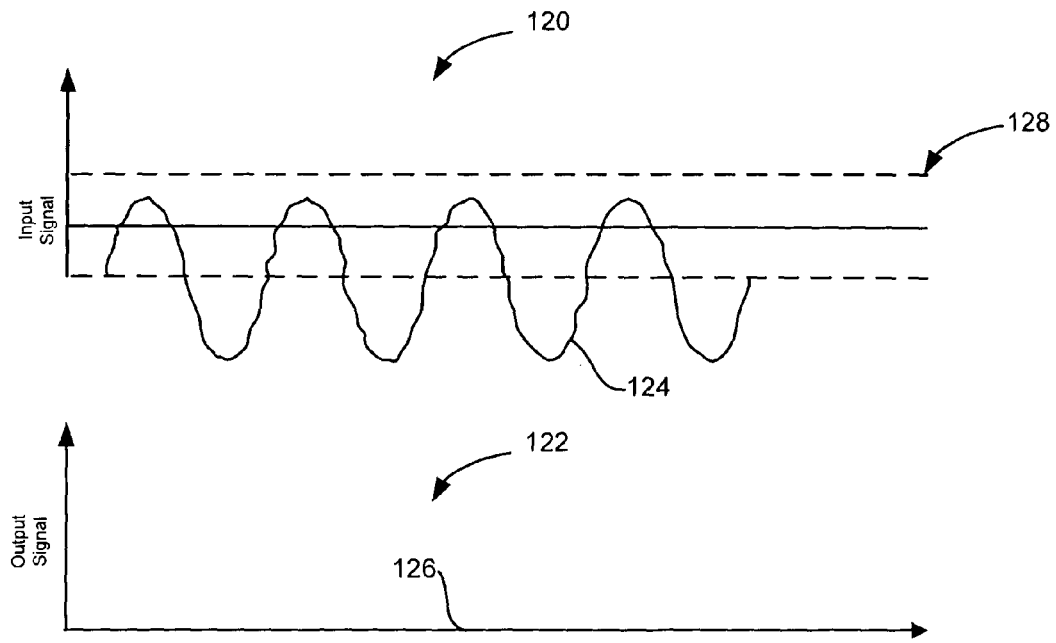
FIG. 4 is a pair of exemplary charts illustrating an input signal from a phase connection having a bad earth connection and a corresponding output signal according to one embodiment of the present disclosure.
Figure 5:
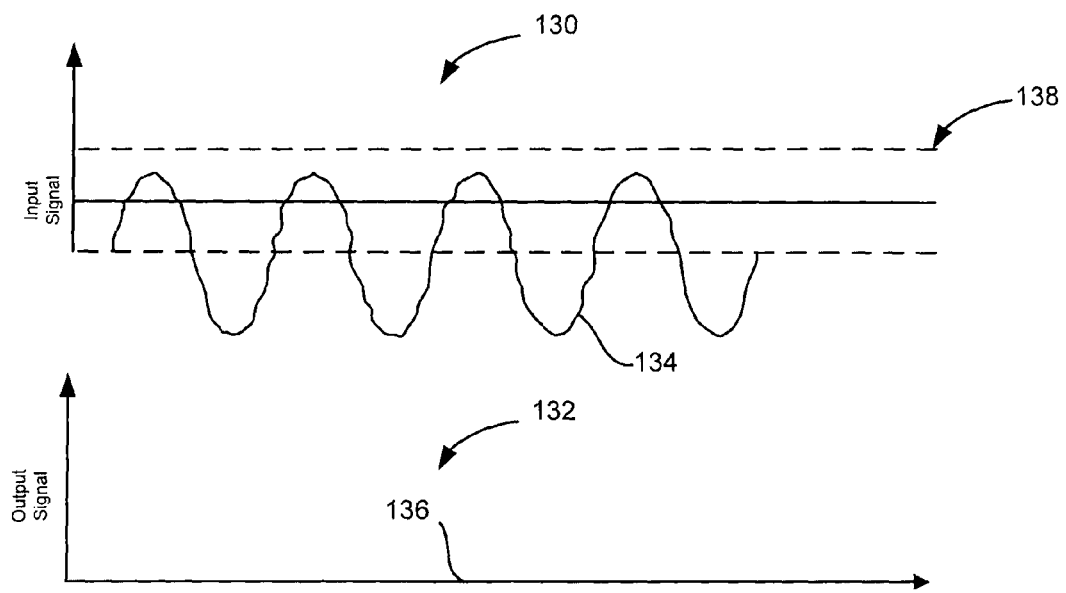
FIG. 5 is a pair of exemplary charts illustrating an input signal from a neutral connection having a bad earth connection and a corresponding output signal according to one embodiment of the present disclosure.

With reference to FIGS. 4 and 5, a set of graphs 120, 122, 130, and 132 illustrate the condition when the ground fault detection circuit 12 determines a faulty or "bad" earth ground connection may exist between the battery charger block 10 and the AC power supply 14. As illustrated, graph 120 includes an input signal 126 indicative of the signal initially received from the phase connection 14 at the first input connection 28. With reference to FIG. 5, graph 130 illustrates an input signal 134 indicative of the signal initially received from the neutral connection 20 at the second input connection 30.

As illustrated in graph 120, the input signal 124 may be shifted downward as a result of a faulty or "bad" earth connection 18. As is further illustrated, the input signal 124 may not exceed a reference voltage 122 which may be established by comparator 52. As a result of the faulty earth connection 22, an output signal 126 (e.g., Out1) may be generated by the battery charger block 10 having a nominal or zero volt output.

With reference to FIG. 5, input signal 134 may also be shifted downward as a result of the faulty or "bad" earth connection 18. The input signal 134 may also not exceed a reference voltage limit 138, as established by the comparator 54. As a result, the fault detection circuit 12 may generate an output signal 136 (e.g., Out2) having a nominal or zero volt output may be generated. The output signal 136 may be generated by comparator block 54. As stated above, the input signals 124, 134 and corresponding output signals 126, 136 are an exemplary illustration of the condition when the ground fault detection circuit 12 determines a faulty or "bad" earth connection may exist between the battery charger block 10 and the AC power supply 14.

Figure 6:
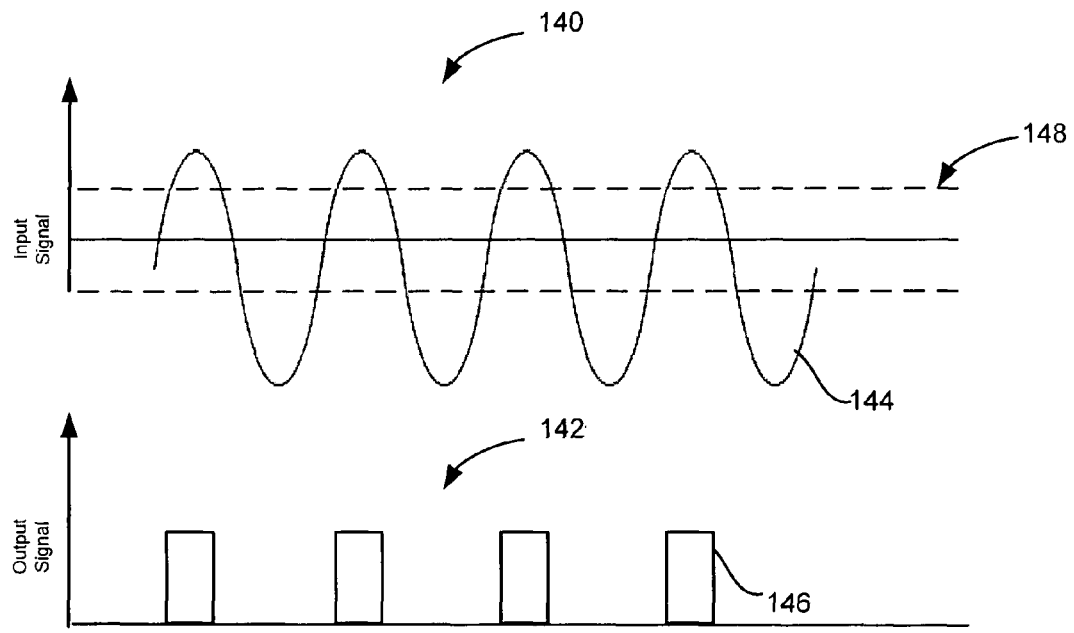
FIG. 6 is a pair of exemplary charts illustrating an input signal from a phase connection and a corresponding output signal according to one embodiment of the present disclosure.
Figure 7:
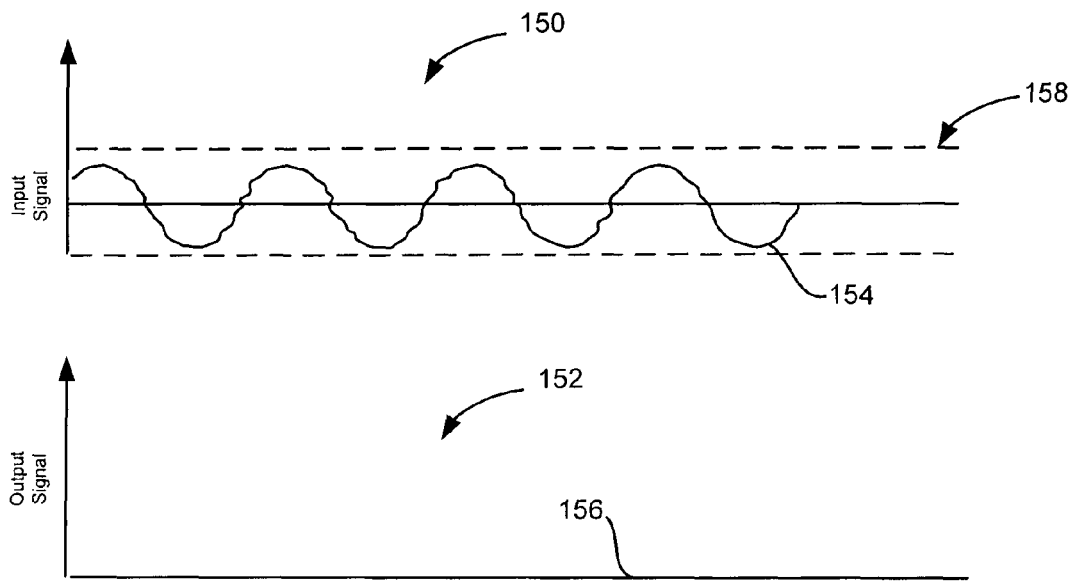
FIG. 7 is a pair of exemplary charts illustrating an input signal from a phase connection and a corresponding output signal according to one embodiment of the present disclosure.

With reference to FIGS. 6 and 7, a set of graphs 140, 142, 150, and 152 illustrate the condition when the ground fault detection circuit 12 determines an earth ground connection may exist between the battery charger block 10 and the AC power supply 14 but the quality of the connection may not be adequate. As illustrated, graph 140 includes an input signal 144 indicative of the signal initially received from the phase connection 14 at the first input connection 28. With reference to FIG. 7, graph 150 illustrates an input signal 154 indicative of the signal initially received from the neutral connection 20 at the second input connection 30.

FIG. 6 further illustrates a corresponding output signal 146 (e.g., Out1) that may be generated by the battery charger block 10. As explained above, the input signal 144 may be corrected by the adaptation block 24 so that only a positive semi-cycle signal is evaluated. However, unlike the input signal 104 generated in FIG. 2, input signal 144 may be shifted slightly downward. Such a downward shift in the effective voltage may occur as a result of increased impedance on the earth connection 22. In addition, a reference voltage limit 148, as established by comparator 52, may be used to determine when the input signal 144 exceeds a pre-defined threshold. As illustrated, when the input signal 144 exceeds the reference voltage limit 148 the comparator 50 may generate a positive pulsed square wave output signal 146. Although output signal 146 may have the same frequency as output signal 106 generated in FIG. 2, output signal 146 may have a shorter duty cycle than the output signal 106. The shorter duty cycle may occur because the input signal 144 is shifted downward and therefore exceeds the reference voltage 148 for a shorter length of time.

With reference to FIG. 7, the input signal 154 illustrated, may be indicative of a signal received from the neutral connection 20. As illustrated, the battery charger block 10 may determine that the input signal 154 does not exceed the reference voltage 158 as established by comparator 54. However, although the reference voltage 154 is not exceeded, the input signal 154 may generate a greater signal then input signal 114 illustrated in FIG. 2. As stated above, the input signals 144, 154 and corresponding output signals 146, 156 are an exemplary illustration of the condition when the ground fault detection circuit 12 may determine an adequate earth connection may exist. The present disclosure contemplates that the quality of the earth ground connection illustrated in FIGS. 6 and 7 may not be adequate as a result of the impedance on the earth connection 22 being at an excessive level.

Figure 8:
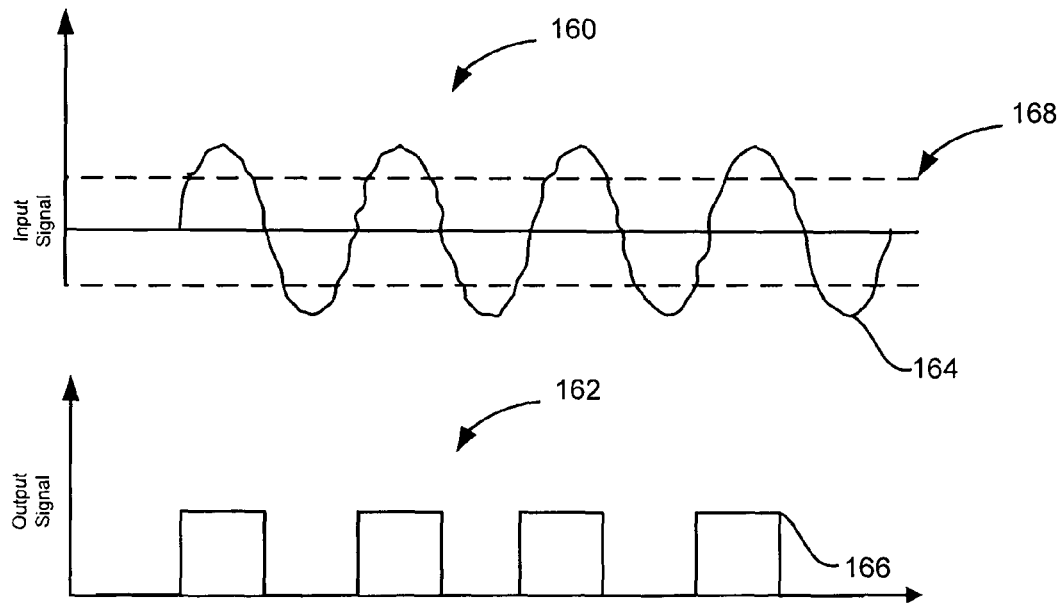
FIG. 8 is a pair of exemplary charts illustrating an input signal from a phase connection and a corresponding output signal according to one embodiment of the present disclosure.
Figure 9:
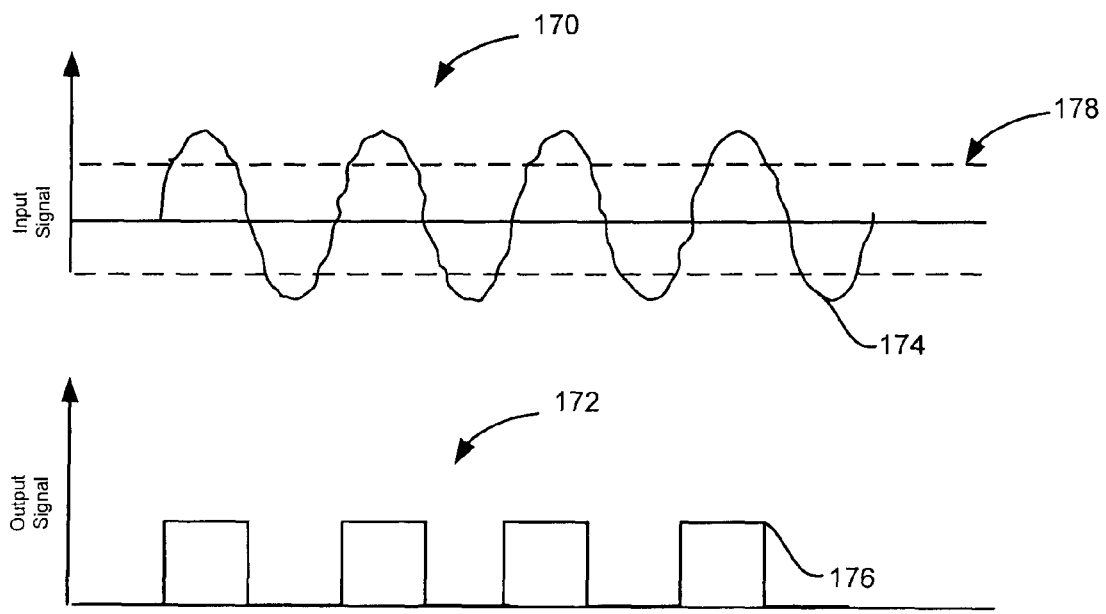
FIG. 9 is a pair of exemplary charts illustrating an input signal from a phase connection and a corresponding output signal according to one embodiment of the present disclosure.

With reference to FIGS. 8 and 9, a set of graphs 160, 162, 170, and 172 illustrate another condition indicative of when the ground fault detection circuit 12 determines a faulty or "bad" earth ground connection may exist between the battery charger block 10 and the AC power supply 14. As illustrated, graph 160 includes an input signal 164 indicative of the signal initially received from the phase connection 14 at the first input connection 28. With reference to FIG. 7, graph 170 illustrates an input signal 174 indicative of the signal initially received from the neutral connection 20 at the second input connection 30.

FIG. 8 illustrates that an output signal 166 may correspondingly be generated as a result of input signal 164 exceeding reference voltage 168. However, FIG. 9 also illustrates that an output signal 176 may be generated as a result of input signal 174 exceeding reference voltage 174. Because both input signals 164, 174 exceed each respective reference voltage 168, 178 a pair of pulsed square waves 166, 176 are generated. As a result of both input signals 164, 174 generating a respective pulsed square wave 166, 176, the fault detection circuit 12 may determine that a faulty or "bad" earth ground connection may exist between the battery charger block 10 and the AC power supply 14.

What is claimed is:

1. A method for determining a faulty earth connection within a vehicle, the method comprising:
   establishing an electrical connection between the vehicle and an external Alternating Current (AC) power source, wherein the electrical connection is a three phase electrical connection configured to receive an input voltage signal on a phase, neutral, and earth connection;
   determining whether the input signal received on the phase connection exceeds a predetermined phase threshold when referenced to the earth connection;
   determining whether input signal received on the neutral connection exceeds a predetermined neutral threshold when referenced to the earth connection; and
   determining that a faulty earth connection exists between the vehicle and the AC power source when the input signal received from the phase connection does not exceed the predetermined phase threshold and the input signal received from the neutral connection does not exceed the predetermined neutral threshold.

2. The method of claim 1 further comprising:
   determining that a faulty earth connection exists between the vehicle and the AC power source when the input signal received from the phase connection exceeds the predetermined phase threshold and the input signal received from the neutral connection exceeds the predetermined neutral threshold.

3. The method of claim 1 further comprising:
   modifying the input signal received from the phase connections so that only a positive phase semi-cycle signal is evaluated; and
   modifying the input signal received from the neutral connections so that only a positive neutral semi-cycle signal is evaluated.

4. The method of claim 3 further comprising:
   limiting the voltage level of each of the positive phase and neutral semi-cycle signals; and
   adapting the impedances and drive currents for each of the phase and neutral semi-cycle signals.

5. The method of claim 4 further comprising:
   filtering the positive phase semi-cycle signals in order to reduce high frequency noise present on the phase connection; and
   filtering the positive neutral semi-cycle signals in order to reduce high frequency noise present on the neutral connection.

6. The method of claim 5 further comprising:
   transmitting the filtered positive phase semi-cycle signal to a first comparator, the first comparator being configured to determine whether the positive phase semi-cycle signal exceeds a predetermined voltage threshold; and
   transmitting the filtered positive neutral semi-cycle signal to a second comparator, the second comparator being configured to determine whether the positive neutral semi-cycle signal exceeds a predetermined voltage threshold.

7. The method of claim 1 further comprising:
   generating one or more output signals indicating the existence of a ground fault condition.

8. The method of claim 7 wherein, the one or more output signals are transmitted to a vehicle safety system, and the vehicle safety system activating a visual alert system when the output signals indicate that a ground fault condition exists.

9. The method of claim 7 wherein, the one or more output signals are transmitted to a vehicle safety system, and the vehicle safety system activating an audible alert system when the output signals indicate that a ground fault condition exists.

10. The method of claim 1 further comprising:
    determining that a ground fault condition does not exist between the vehicle and the AC power source when the input signal received from the phase connection exceeds the predetermined phase threshold and the input signal received from the neutral connection does not exceed the predetermined neutral threshold.

11. The method of claim 1 further comprising:
    generating one or more output signals indicating the existence of a faulty earth connection; and
    transmitting the one or more output signals to a vehicle safety system.

12. A system used for determining a faulty earth connection within a vehicle, the system comprising:
    an electrical connector used for electrically connecting the vehicle and an external Alternating Current (AC) power source, wherein the electrical connector is a three phase electrical connector configured to receive a corresponding input voltage signal on a phase, neutral, and earth connection; and
    a controller configured to:
      determine whether the input signal received on the phase connection exceeds a predetermined phase threshold when referenced to the earth connection;
      determine whether input signal received on the neutral connection exceeds a predetermined neutral threshold when referenced to the earth connection; and
      determine that a ground fault condition exists between the vehicle and the AC power source when the input signal received from the phase connection does not exceed the predetermined phase threshold and the input signal received from the neutral connection does not exceed the predetermined neutral threshold.

13. The system of claim 12, wherein the controller includes an adaption circuit and a controller circuit.

14. The system of claim 13, wherein the adaptation circuit is configured to:
    modify the input signal received from the phase connections so that only a positive phase semi-cycle signal is evaluated; and
    modify the input signal received from the neutral connections so that only a positive neutral semi-cycle signal is evaluated.

15. The system of claim 14, wherein the adaptation circuit is further configured to:
    limit the voltage level of each of the positive phase and neutral semi-cycle signals; and adapt the impedances and drive currents for each of the phase and neutral semi-cycle signals.

16. The system of claim 15, wherein the adaptation circuit is further configured to:
   filter the positive phase semi-cycle signals in order to reduce high frequency noise present on the phase connection,
   filter the positive neutral semi-cycle signals in order to reduce high frequency noise present on the neutral connection.

17. The system of claim 16, wherein the comparator circuit includes a first and second comparator, the first comparator being configured to determine whether the positive phase semi-cycle signal exceeds the predetermined phase threshold, and the second comparator being configured to determine whether the positive neutral semi-cycle signal exceeds a predetermined neutral threshold.

18. The system of claim 17, wherein the comparator circuit is further configured to:
   generate one or more output signals indicating the existence of a ground fault condition; and
   transmit the one or more output signals to a vehicle safety system.

\* \* \* \* \*